US006960528B2

(12) United States Patent
Chen et al.

(10) Patent No.: US 6,960,528 B2
(45) Date of Patent: Nov. 1, 2005

(54) METHOD OF FORMING A NANOTIP ARRAY IN A SUBSTRATE BY FORMING MASKS ON PORTIONS OF THE SUBSTRATE AND ETCHING THE UNMASKED PORTIONS

(75) Inventors: Kuie-Hsien Chen, Taipei (TW); Jih Shang Hwang, Tau-Yuen (TW); Debajyoti Das, West Bengal (IN); Hong Chun Lo, Sun-Yi (TW); Li-Chyong Chen, Taipei (TW)

(73) Assignee: Academia Sinica, Taipei (TW)

(*) Notice: Subject to any disclaimer, the term of this patent is extended or adjusted under 35 U.S.C. 154(b) by 0 days.

(21) Appl. No.: 10/247,886

(22) Filed: Sep. 20, 2002

(65) Prior Publication Data

US 2004/0056271 A1 Mar. 25, 2004

(51) Int. Cl.⁷ .......................................... H01L 21/461
(52) U.S. Cl. ...................... 438/695; 438/710; 438/715; 438/732; 438/778
(58) Field of Search .............................. 438/695, 710, 438/713, 715, 719, 728, 732, 778

(56) References Cited

U.S. PATENT DOCUMENTS

| | | | |
|---|---|---|---|
| 4,558,507 A * | 12/1985 | Okabayashi et al. | 438/301 |
| 5,443,997 A * | 8/1995 | Tsui et al. | 438/715 |
| 5,528,081 A * | 6/1996 | Hall | 257/768 |
| 5,628,659 A * | 5/1997 | Xie et al. | 445/3 |
| 5,935,454 A | 8/1999 | Tada et al. | 216/41 |
| 6,057,172 A | 5/2000 | Tomihari | 438/20 |
| 2002/0084502 A1 * | 7/2002 | Jang et al. | 257/432 |

OTHER PUBLICATIONS

V.V. Zhirnov et al., "Chemical Vapor Deposition and Plasma-Enhaced Chemical Vapor Deposition Carbonization of Silicon Microtips," J. Vac. Sci. Technol. B, vol. 12, No. 2, Mar./Apr. 1994, pp. 633–637.*

K. Seeger and R.E. Palmer, "Fabrication of silicon cones and pillars using rough metal films as plasma etching masks," Applied Physics Letter, 74(11):1627–1629, Mar. 1999.

Yoshida et al., "Formation of GaN Self-Organized Nanotips by Reactive Ion Etching," Jpn. J. Appl. Phys. 40:L1301–L1304, Dec. 2001.

Wong et al., "Field-emission properties of multihead silicon cone arrays coated with cesium," Applied Physics Letters, 80(5):877–879, Feb. 2002.

Tada et al. *Formation of 10 nm Si structures using size-selected metal clusters* J. Phys. D.: Appl. Phys. vol. 31 (1998) L21–L24.

Tada et al. *Fabrication of size-controlled 10-nm Scale Si Pillars using Metal Clusters as formation Nuclei MicroElectronic Engineering* vol. 41/42 (Mar. 1998) 539–542.

* cited by examiner

*Primary Examiner*—Stephen W. Smoot
(74) *Attorney, Agent, or Firm*—Fish & Richardson P.C.

(57) ABSTRACT

Nanotip arrays are formed by exposing a substrate to a process gas mixture that simultaneously forms nanomasks on the substrate surface and etches exposed portions of the substrate surface to form the nanotip array. Components of the process gas mixture form nanocrystallites on the surface of the substrate, thereby masking portions of the substrate from other components of the process gas mixture, which etch exposed portions of the substrate. Accordingly, nanotip arrays formed using this technique can have nanocrytallite endpoints.

50 Claims, 4 Drawing Sheets

METHOD OF FORMING A NANOTIP ARRAY IN A SUBSTRATE BY FORMING MASKS ON PORTIONS OF THE SUBSTRATE AND ETCHING THE UNMASKED PORTIONS

TECHNICAL FIELD

This invention relates to nanotip arrays and methods for making nanotip arrays.

BACKGROUND

Nanometer-scale tips, or nanotips, are microscopic filaments that have endpoint-diameters on the nanometer scale. Nanotips have attracted considerable interest in the last decade because of distinctive differences in the properties (e.g., electrical and optical properties) of these nanostructures compared with bulk material. Nanotips are of increasing interest to numerous industries due to their potential for commercial application as, e.g., emitters in field emission display ("FED"), nanometer-cantilevers, solar cells, and electrochemical electrodes.

Arrays of nanotips also have many potential applications, particularly those having near stress-free conditions. Nanotip arrays can be monolithic, i.e., formed from a single piece of material. Nanotip arrays can be formed by selectively etching material from a single substrate, where unetched portions of the substrate surface form the nanotips. Monolithic approaches are attractive for forming nanotips and nano-scale junctions that can be easily integrated with fabrication processes for semiconductor devices.

Many techniques for forming nanotip arrays involve dry etching substrate material from a substrate surface partially covered by pre-formed nanometer-sized masks (nanomasks). Nanomasks protect the covered portions of the substrate surface, preventing material from being etched away during the etching process. There are numerous techniques for preparing nanomasks, including, e.g., electron-beam lithography, condensing gas onto the substrate, sputtering a discontinuous or layer of varying thickness onto the substrate, or oxidizing portions of the substrate to form the nanomasks.

SUMMARY

The invention generally relates to nanotip arrays and methods for forming nanotip arrays. In certain aspects, the invention is based on the discovery that nanotip arrays can be formed by exposing a substrate to a process gas mixture that simultaneously forms nanomasks on the substrate surface and etches exposed portions of the substrate surface to form the nanotip array. Components of the process gas mixture form nanocrystallites on the surface of the substrate, thereby masking portions of the substrate from other components of the process gas mixture, which etch exposed portions of the substrate. Accordingly, nanotip arrays formed using this technique can have nanocrystallite endpoints.

In general, in a first aspect, the invention features a method for making a nanotip array. The method includes exposing a substrate to a plasma sufficient to form a mask material at the surface of the substrate, thereby forming masked portions of the substrate and unmasked portions of the substrate, and simultaneously etching the unmasked portions of the substrate to form a plurality of nanotips in the nanotip array.

Implementations of the invention can include one or more of the following features. In some embodiments, there is substantially no etching of the substrate at the masked portions.

The method can include ionizing a process gas mixture to form the plasma. The process gas mixture can be ionized by exposing the process gas mixture to an electromagnetic field. The plasma can include mask components that form the mask material at the substrate surface. The mask components can chemically react with each other to form the mask material. The mask material can include crystallites, e.g., SiC crystallites. The plasma can include etch components that etch unmasked portions of the substrate. The process gas mixture can include a silicon-containing gas (e.g., a silane gas). The process gas mixture can include a carbon-containing gas (e.g., an alkane gas, and alkene gas, or an alkyne gas). A pressure of the process gas mixture can be at least 0.1 mTorr. The pressure of the process gas mixture can be no more than 10 mTorr. The process gas mixture can include argon, hydrogen, and/or a halogen or a halogenated material.

The substrate can be heated to at least 200° C. (e.g., at least 300° C., at least 400° C., at least 500° C., at least 600° C., at least 700° C., at least 800° C., at least 900° C., at least 1,000° C.).

The plasma can chemically etch unmasked portions of the substrate. Alternatively, or additionally, the plasma can physically etch unmasked portions of the substrate.

In some embodiments, the masked portions have diameters less than 20 nm (e.g., less than 10 nm, less than 5 nm).

The substrate can include a substrate material that includes silicon, sapphire, quartz, silica, germanium, gallium nitride, gallium arsenide, gallium phosphide or a metal.

At least some of the nanotips can have a length of more than 500 nm (e.g., more than 1,000 nm). At least some of the nanotips can have an endpoint diameter of less than 10 nm (e.g., less than 5 nm, less than 2 nm). At least some of the nanotips can have an endpoint that comprises a SiC crystallite.

In some embodiments, the method further includes covering a premask portion of the substrate surface with a premask layer that prevents formation of nanotips in the premasked portions. The premask layer can include silicon nitride, silicon dioxide or a metal.

The method can include positioning a template relative the substrate surface to control the location of nanotip formation on the substrate surface. The template can include an anodic aluminum oxide template, a zeolite template, a porous silicon template, and/or a diamond template.

Alternatively, or additionally, implementations of the invention can include one or more of the features described in regard to other aspects of the invention.

In a second aspect, the invention features a method for forming nanotip arrays, which includes forming SiC crystallites at a surface of a substrate, thereby forming masked portions of the substrate and unmasked portions of the substrate, and etching unmasked portions of the substrate to form the nanotip array.

Implementations of the invention can include one or more of the features described in regard to other aspects of the invention. Alternatively, or additionally, implementations of the invention can include one or more of the following features.

There can be substantially no etching of the substrate at the masked portions.

In some embodiments, the method can include exposing the substrate to a plasma under conditions sufficient to form the SiC crystallites and to etch unmasked portions of the substrate. The method can include ionizing a process gas mixture to form the plasma. The process gas mixture can be ionized by electron cyclotron resonance.

The etching can include chemical etching and/or physical etching. The forming and etching can occur simultaneously.

In another aspect, the invention features an article including a nanotip array, in which nanotips in the nanotip array have endpoints including silicon carbide.

The nanotip array can be formed by the methods described in regard to the first and second aspects of the invention.

Embodiments of the nanotip array can include one or more of the following features.

The nanotip array can be a monolithic nanotip array.

At least some of the nanotip endpoints can include SiC crystallites. At least some of the nanotip endpoints can have diameters less than 10 nm (e.g., less than 5 nm, less than 1 nm). The nanotip array can have a nanotip density of more than $5 \times 10^9$ cm$^{-2}$ (e.g., more than about $10^{10}$ cm$^{-2}$, more than about $10^{11}$ cm$^{-2}$). At least some of the nanotips can have a length of more than 500 nm (e.g., at least 1,000 nm).

The nanotips can be tapered nanotips or cylindrical nanotips.

The article can include a base, and a surface of the base can include the nanotip array. The base can include a base material, the base material being silicon, sapphire, quartz, silica, germanium, gallium nitride, gallium arsenide, gallium phosphide or a metal. The base can be a planar base. The base can be a cantilever.

The article can include carbon nanotubes attached to the endpoints of at least some of the nanotips of the nanotip array.

The article can be a bio-analysis substrate, a solar cell. The article can include an electrode to apply a voltage across the nanotip array sufficient to cause the nanotip array to emit electrons. The article can include nanoparticles disposed on the nanotips (e.g., Fe or Au nanoparticles).

A print head can include a pair of electrodes, and at least one of the electrodes can include the article.

An organic light emitting device can include a pair of electrodes, and at least one of the electrodes can include the article.

Alternatively, or additionally, embodiments of the article can include one or more of the features described in regard to other aspects of the invention.

In a further aspect, the invention features a nanotip including a first portion including a first material and a second portion including a second material, and the first material is SiC.

The nanotip can be formed using methods described in regard to other aspects of the invention. The nanotip can also include one or more of the features described in regard to other aspects of the invention, and/or one or more of the following features.

The first portion can be an endpoint. The endpoint can have a diameter of less than 10 nm (e.g., less than 5 nm, less than 1 nm).

The first material can include at least 90% of the first portion (e.g., at least 99% of the first portion). The second material can include at least 90% of the second portion (e.g., at least 99% of the second portion). The second material can be silicon, sapphire, quartz, silica, germanium, gallium nitride, gallium arsenide, gallium phosphide or a metal.

The nanotip can have a length of at least 500 nm (e.g., at least 1,000 nm).

Embodiments of the invention may have one or more of a number of advantages. For example, nanotip arrays can be made using a single-step method. This can be simpler and more economical than other methods. Moreover, nanotip arrays can be produced with a high degree of uniformity. Furthermore, nanotip arrays can be uniformly produced over a large area. High-density nanotip arrays can be produced, with small tip diameters and large aspect ratios.

Nanotip arrays can be advantageously used in numerous applications. For example, nanotip arrays can be used in field emission devices, such as field-emission displays. Nanotip arrays can also be used in ultrahigh resolution scanning probe microscopy ("SPM") and field emission microscopy ("FEM"), special electrodes for electrochemistry, and as substrates for bioanalysis.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

DESCRIPTION OF DRAWINGS

Like reference symbols in the various drawings indicate like elements.

DETAILED DESCRIPTION

Figure 1:
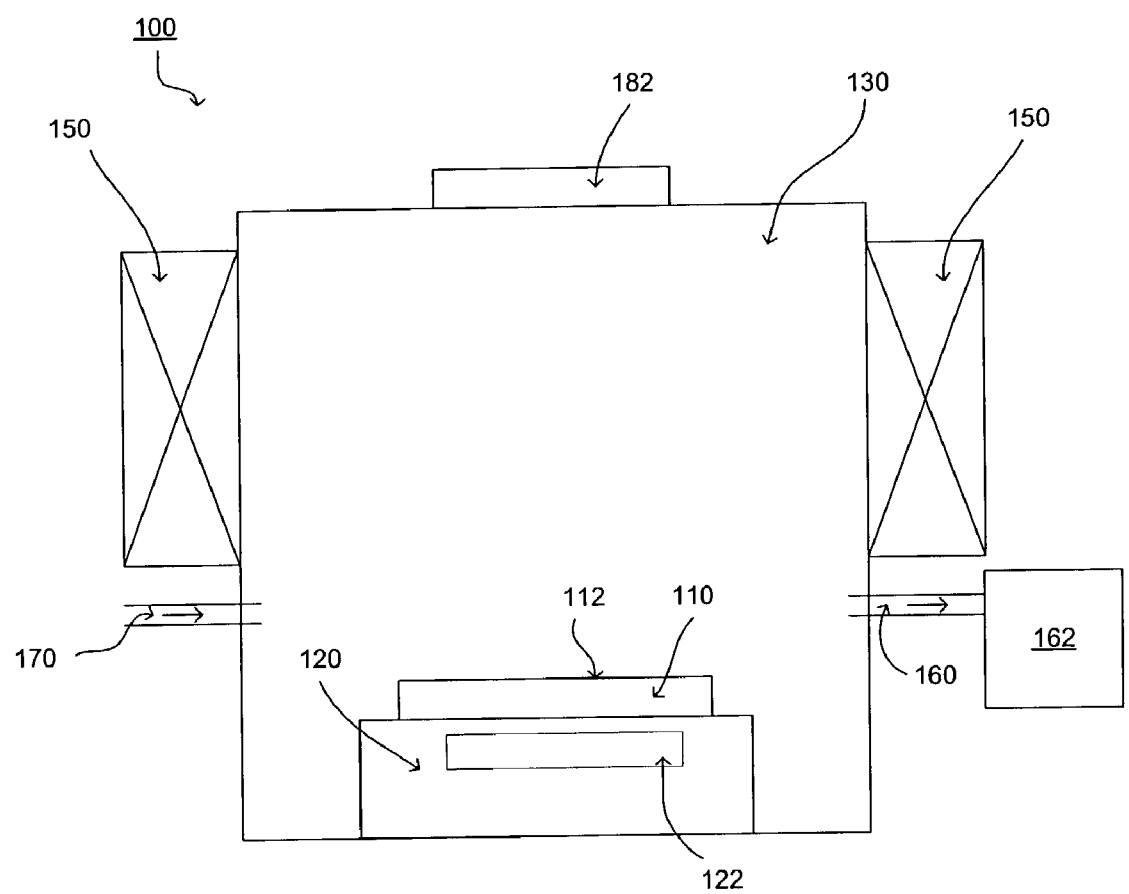
FIG. 1 is a schematic diagram of a plasma etching system.

Referring to FIG. 1, a plasma etching system 100 is used to form a nanotip array using a dry-etch process. A substrate 110, e.g., a silicon substrate, is placed on a stage 120 in a chamber 130 of system 100 to expose a substrate surface 112. Stage 120 includes a heater 122, which heats substrate 110 to above 200° C. (e.g., more than 300° C., more than 400° C., more than 500° C., more than 600° C., more than 700° C., more than 800° C., more than 900° C., more than 1,000° C.). System 100 includes electromagnets 150 for applying a magnetic field to the gas inside chamber 130. System 100 also includes a quartz window 182, which introduces a microwave electromagnetic ("EM") field from a microwave source (not shown) to a gas inside chamber 130, exciting a plasma in the chamber. Excitation energy is provided by the microwave EM field while the additional magnetic field applied by electromagnets 150 cause the electrons in the plasma to coil and enhance collisions with other gases.

Prior to exciting the plasma, a pump 162 evacuates air from chamber 130 via port 160. Once chamber 130 is sufficiently evacuated, a process gas mixture is introduced into the evacuated chamber via port 170. The composition of the process gas mixture is appropriately selected to mask and etch the substrate material during etching conditions. An example of a process gas mixture is a mixture of hydrogen, argon, methane and silane, which are introduced into the chamber at 0–10 standard cubic centimeters per minute (sccm), 1–5 sccm, 1–4 sccm, and 0.1–1 sccm, respectively.

Once the pressure of the process gas mixture in chamber 130 is sufficiently high, e.g., between 0.1 mTorr and 10 mTorr (such as at least 0.2 mTorr, at least 0.5 mTorr, at least 1 mTorr, at least 2 mTorr, at least 5 mTorr, at least 8 mTorr), electromagnets 150 apply a DC magnetic field having field strength of between about 875 Gauss and 1300 Gauss across a portion of chamber 130. Simultaneously, an AC electric field, e.g., a microwave field at 2.45 GHz, is applied across the portion of chamber 130. The microwave field in the presence of the magnetic field causes electrons in the process gas to spiral at the microwave frequency, thus increasing the probability of ionization. This process of ionization is known as electron cyclotron resonance (ECR). The resulting ionization forms the plasma in chamber 130.

The microwave power of the ECR system is adjusted to achieve desired nucleation and etching. Typical microwave powers are in the 50 W to 2,500 W range (e.g., at least 100 W, at least 200 W, at least 500 W, at least 1,000 W, at least 1,500 W, at least 2,000 W). Under these conditions, Si-ions and C-ions, from silane and methane, respectively, form SiC nanocrystallites as nanometer-sized masks on substrate surface 112, while argon and hydrogen physically and chemically etch exposed portions of substrate 110. The SiC nanocrystallites are typically on the order of one to 10 nm in dimension, although depending on the exact composition of the process gas and the etch conditions they can be smaller than one nm or larger than 10 nm. For example, the process temperature can affect the nanomask size. In some embodiments, the size nanomasks decreases with increasing temperature. Without wishing to be bound by theory, it is believed that at higher substrate surface temperatures, adatoms for the formation of SiC nanomasks can have higher surface energy, and hence increased mobility. The increased mobility can increase the probability that an adatom will find a lower energy configuration on the Si substrate surface. A lower energy configuration is more stable. Hence, a higher surface temperature can make a fewer number of sites available for nanomasking. Nanomask size can also be affected by the number of adatoms available at a nucleation site. An increase in the number of SiC clusters available in the plasma can increase the average nanomask size. The number of SiC clusters in the plasma can be increased by increasing the working gas pressure and/or by increasing the flow of silicon and carbon containing gases (e.g., $SiH_4$ and $CH_4$). The number of SiC clusters can also be influenced by the applied electrical power. For example, higher power levels can increase the number of SiC clusters.

Ar-ions, from the Ar-plasma, can physically etch substrate material from unmasked portions of the substrate surface. Similarly, atomic-H, created in high density by the ECR condition, can chemically etch substrate material from the unmasked portions. Hence, two competing processes, namely forming the SiC nanomasks on the substrate surface and etching the unmasked portions of the substrate surface, coexist during this ECR process. Substrate 10 is etched until the unmasked portions of the substrate have been etched to a desired depth.

Figure 2:
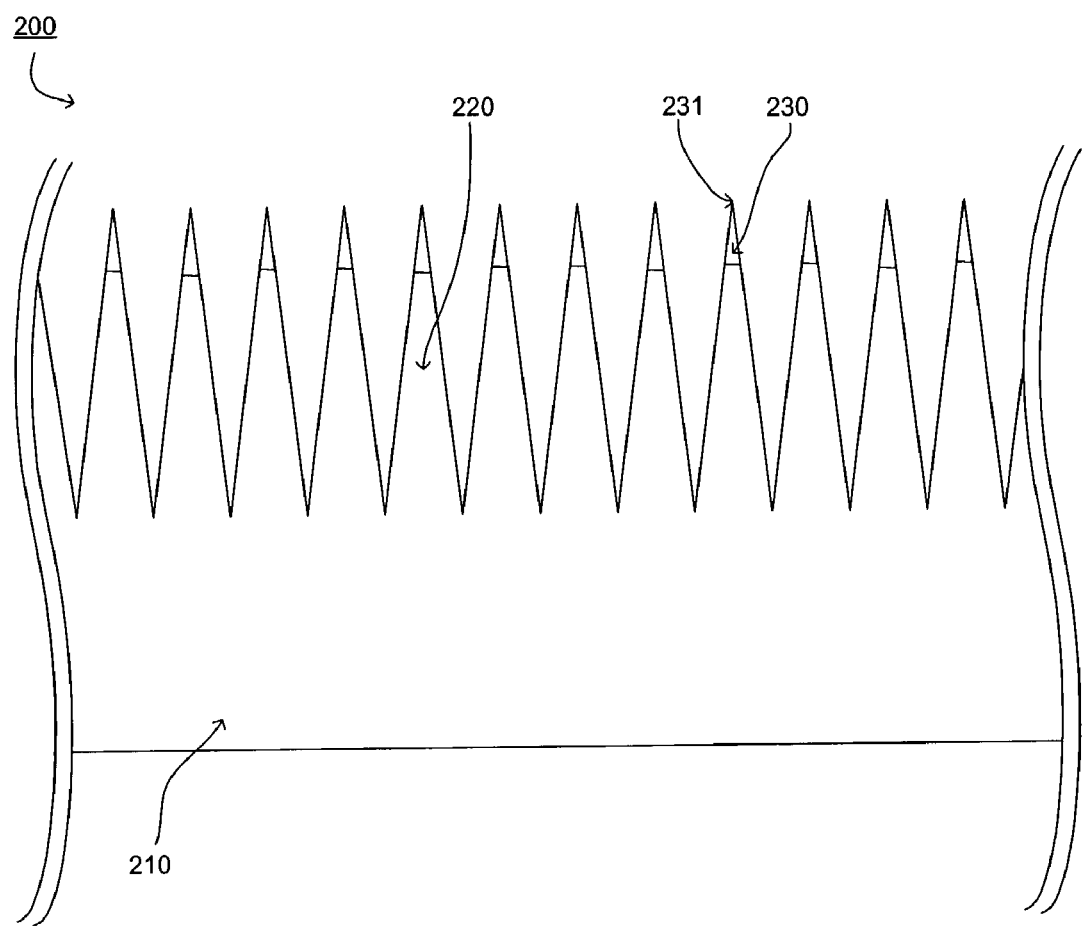
FIG. 2 is a cross-sectional view of monolithic nanotip array.

Referring to FIG. 2, by etching the exposed substrate surface, the ECR plasma forms nanotip array 200. Each nanotip in nanotip array 200 includes a tapered silicon column 220 and SiC cap at endpoint 230. Endpoint 230 has an endpoint diameter 231. The SiC caps are the residual nanomasks formed during the ECR etch. The nanotips are attached to silicon base 210, which is the unetched portion of the silicon substrate. Nanotip array 200 is a monolithic array as the nanotip columns and base 210 are all formed from a single piece of silicon.

The length of the nanotips depend on the etch rate and exposure time. At a constant etch rate, the greater the etch time, the more material is removed from the unmasked portions and the longer the nanotips are likely to be. Depending the etch conditions and desired nanotip length, the etch time can vary from a few minutes to several hours (e.g., more than one minute, more than five minutes, more than 10 minutes, more than 20 minutes, more than 30 minutes, more than 45 minutes, more than 60 minutes, more than 100 minutes, more than 200 minutes, more than 300 minutes, more than 500 minutes, more than 600 minutes, more than 800 minutes, more than 1,000 minutes, more than 1,500 minutes) In general, the nanotips can be from a few tens of nanometers to microns in length (e.g., more than 50 nm, more than 100 nm, more than 500 nm, more than 1,000 nm, more than 1,500 nm, more than 2,000 nm).

In general, endpoint diameter 231 is related to the diameter of the corresponding nanomask. In some embodiments, endpoint diameter 231 can be extremely small. For example, the endpoint diameter 231 can be less than about 30 nm, e.g., less than about 20 nm, less than about 10 nm, less than 5 nm, less than 2 nm, less than 1 nm.

Nanotips can have a high aspect ratio such as, for example, more than 1:20 (e.g., more than 1:50, more than 1:100, more than 1:200, more than 1:500, more than 1:1,000). The aspect ratio is the ratio of the nanotip endpoint diameter to the nanotip length.

The nanotips in array 200 are tapered. Tapered nanotips have a larger diameter at their base than at their tip. In some embodiments, the nanotips can be cylindrical. Cylindrical nanotips have a diameter that is substantially equal along their length. Alternatively, some nanotips can have a larger diameter at their tip than at their base. In further embodiments, nanotip arrays can include combinations of tapered and cylindrical nanotips.

The density of nanotips in an array depends on the density of nanomasks formed during the ECR process. Nanomask density can be varied by, for example, varying the relative and absolute partial pressures the process gas components, and/or varying the substrate temperature. For example, increasing the process temperature can reduce the nanomask density. In some embodiments, the nanomask density, and corresponding nanotip density can be high, such as $5 \times 10^9$ $cm^{-2}$ or more (e.g., more than $10^{10}$ $cm^{-2}$, more than $5 \times 10^{10}$ $cm^{-2}$, more than $10^{11}$ $cm^{-2}$, more than $5 \times 10^{11}$ $cm^{-2}$).

The nanotips in array 200 are perpendicular to a plane defined by base 210. In general, the orientation of nanotips depends on process factors, such as the orientation of the substrate with respect to the EM field. In a typical ECR system, ions move with high velocity along a conical flux and are incident on an un-tilted substrate surface substantially perpendicular to the surface normal, when the substrate is placed at the center of the reaction chamber. Accordingly, desired nanotip orientation can be achieved by adjusting the orientation of the substrate with respect to the RF field, e.g., by providing a tilted stage. Nanotip orientation can also depend on properties of the substrate material, such as grain orientation with respect to the plane of the substrate. Accordingly, nanotips need not be perpendicular to the plane of the substrate. For example, nanotips can subtend an acute angle with the plane of the substrate (e.g., less than 90°, less than 75° C., less than 60° C., less than 45°, less than 30° C., less than 15° C.). Nanotip orientation can also depend on properties of the substrate such as, for example, the orientation of the crystalline axis with respect to the plane of the substrate.

Although the above-described embodiment refers to a silicon substrate, nanotip arrays can be formed using other substrate materials. Other suitable substrate materials include, for example, sapphire, quartz, silica, germanium, gallium nitride, gallium arsenide, gallium phosphide, and metals, such as copper and aluminum. In some embodiments, the substrate material can be doped with a dopant. Examples of dopants for a silicon substrate include electron donors, such as phosphorus or electron acceptors, such as boron. In some embodiments, the substrate can include composite and/or multilayer materials. An example of a multilayer substrate is a metal-oxide-semiconductor multilayer.

While the above-described embodiment refers to a process gas mixture including a specific combination of gases, other gases can also be used. In general, the process gas mixture should include one or more gases that, under appropriate conditions, form nanomasks on the substrate surface. For example, to form SiC crystallites the gas mixture should include a source of silicon. About 0.5–5 at. % of the process gas mixture can be silicon (e.g., more than 1 at. %, more than 2 at. %, more than 3 at. %, more than 4 at. %). The process gas mixture should also include a source of carbon. About 5–20 at. % of the process gas mixture can be carbon (e.g., more than 6 at. %, more than 8 at. %, more than 10 at. %, more than 12 at. %, more than 14 at. %, more than 16 at. %, more than 18 at. %). Appropriate silicon-containing gases include monosilane and disilane. Carbon-containing gases include methane, ethane, and acetylene. Alternatively, or additionally, the process gas can include gases that contain both silicon and carbon, for example, methylsilane ($CH_3SiH_3$), dimethylsilane (($CH_3)_2SiH_2$), trimethylsilane (($CH_3)_3SiH$), tetramethylsilane ($CH_3)_4Si$), and tetramethyldisilozane.

More generally, nanomasks can be formed from materials other than SiC. Suitable materials for nanomasking should exhibit a high degree of hardness and/or chemical inertness with respect to the etching plasma and relative to the substrate material. Examples of other nanomask materials suitable for masking a silicon substrate are $Si_3N_4$ and SiCN. Some oxides may also be suitable materials for masking silicon (e.g., SiO and SiCNO).

Furthermore, the process gas should include one or more gases that, under appropriate conditions, etch the substrate material. Silicon substrates, for example, can be etched using argon (e.g., about 2–80 at. %) and hydrogen (e.g., about 0–80 at. %). About 2–80 at. % of the process gas mixture can be argon (e.g., more than 5 at. %, more than 10 at. %, more than 15 at. %, more than 20 at. %, more than 25 at. %, more than 30 at. %, more than 35 at. %, more than 40 at. %, more than 45 at. %, more than 50 at. %, more than 55 at. %, more than 60 at. %, more than 65 at. %, more than 70 at. %, more than 75 at. %). About 0–80 at. % of the process gas mixture can be hydrogen (e.g., more than 1 at. %, more than 2 at. %, more than 5 at. %, more than 10 at. %, more than 15 at. %, more than 20 at. %, more than 25 at. %, more than 30 at. %, more than 35 at. %, more than 40 at. %, more than 45 at. %, more than 50 at. %, more than 55 at. %, more than 60 at. %, more than 65 at. %, more than 70 at. %, more than 75 at. %). Additional examples of gases that can etch silicon are gases that include halogens (e.g., chlorine and/or fluorine) and/or halogenated materials (e.g., sulphur hexafluoride and carbon tetrafluoride).

In general, the composition of the process gas depends on the substrate and nanomask material desired. The aforementioned combination of gases may be suitable to etch substrates other than silicon, although other gas combinations can also be used. In addition to $SiH_4$, a combination of gases including, for example, $CH_4$, $N_2$, $O_2$, $CO_2$, $NO_2$, may be used depending on the particular nanomask desired. Other silicon-containing and carbon-containing gases can be used as well.

Additional gases can also be included in the gas mixture. For example, an inert gas, such as helium and neon, can be included in the gas mixture to adjust the pressure of the chamber during the masking/etching process.

Figure 3:
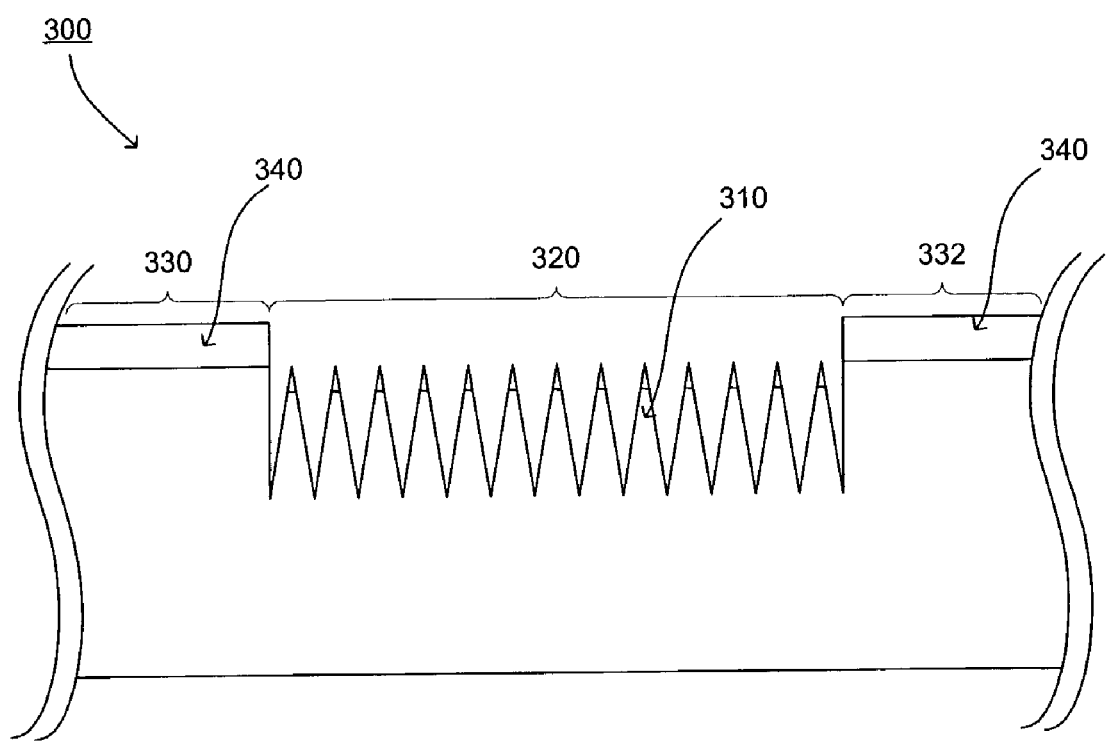
FIG. 3 is a cross-sectional view of a nanotip array formed in a masked substrate.

In some embodiments, portions of the substrate surface are pre-coated with a protective mask to allow selective area etching of nanotip arrays. An example of such a pre-masked nanotip array 300 is illustrated in FIG. 3. During etching, nanotips 310 form in an uncoated portion 320 of a substrate surface, while no nanotips form in surface portions 330 and 332, which are coated with mask 340. Suitable materials for pre-masking should exhibit a high degree of hardness and/or chemical inertness with respect to the etching plasma. For example, silicon nitride is a suitable material for pre-masking a silicon substrate surface.

Patterned nanotip arrays can also be formed using removable templates to selectively expose portions of a substrate surface to nanomask formation. For example, a template having nanometer-scale structure can be placed on the substrate surface during a masking plasma exposure. Suitable template materials include anodic aluminum oxide, diamonds, zeolites, and porous silicon. The template allows nanomasks to form only in unmasked portions of the surface. The template is removed before re-exposing the substrate surface to an etching plasma (i.e., a plasma that does not include components for forming nanomasks). During this exposure, regions of the substrate surface that were masked during the initial plasma exposure are etched as no nanomasks were able to form there during the masking exposure. This templating process is advantageous as it allows one to accurately control the location and density of nanotips in the nanotip array.

Nanotip arrays are an excellent candidate for field emission devices. A field emission device emits a current when exposed to a sufficiently high externally-applied electric field. The field emission properties of the above-described nanotip arrays can be adequate for numerous field emission applications utilizing Si-based technologies, such as field effect displays, microwave power amplifiers, vacuum sensors, and portable low power imaging systems.

Furthermore, using the above-described methods, nanotips can be formed on top of other tips, such as a sub-micrometer-sized silicon cantilevers widely used for scanning probe microscopy ("SPM"). In these applications, nanotip arrays can improve the resolution of SPM probes, in some cases by several orders of magnitude (e.g., several hundred-fold). To control the location of the nanotip arrays on, e.g., SPM probes, nanotip arrays can be further trimmed by a focus ion beam ("FIB").

Nanotip arrays can also be used as substrates for, e.g., forming arrays of additional nanostructures. In some embodiments, highly aligned, narrow carbon nanotubes ("CNT's") can be grown on nanotip endpoints. One way to grow CNT's is to deposit an Fe catalyst on the nanotip endpoints, e.g., using physical vapor deposition. Once Fe nanoparticles have formed, a narrow (e.g., a few nanometers in diameter) CNT can be grown on each nanotip endpoint.

Nanotip arrays can also be used for bio-analysis. For example, nanotip array can be used as porous silicon substrates for deposition of bio-materials, such as a peptides and/or proteins. The substrate and bio-material sample forms an effective source for bio-analysis, such as ion-cyclotron-resonance ("ICR") mass spectroscopy, which is a versatile method for examining the gas-phase chemical reactions of ions with organic, inorganic and organo-metallic compounds Furthermore, variations in the structure of materials at the nanometer scale can affect their absorption properties. For example, bulk silicon has a bandgap of 1.1 eV, which is the minimum photon energy for silicon optical absorption. However, due to the nanostructural nature of silicon nanotip arrays, the absorption minimum can be extended to lower energy. Accordingly, nanotip arrays can be used in various electro-optic devices such as photodetectors and solar cells. In solar cells, for example, a decrease in bandgap would increase absorption of long wavelength optical radiation and infrared regions of the solar spectrum. Such increased absorption could provide higher solar energy conversion than for cells using bulk silicon.

Nanotip arrays can also be used in printing applications that use field emission electrons. Examples of printing applications using field emission electrons are described in U.S. Pat. No. 5,166,709, entitled "ELECTRON DC PRINTER." In such applications, a DC operated printhead emits electrons by field emission at each crossing of first and second electrodes. Nanotip arrays can be used to replace the cathode emitting cone described in this patent. Accordingly, in som embodiments, a nanotip array and an anode aperture can be arranged to form a gap that is less than the electron mean free path in an ambient atmosphere, and are preferably closely spaced to form a substantially collimated beam. A third electrode can accelerate and clean up the beam. Different gases may be used to increase emission or transport efficiency, and enhance electrode lifetime.

Nanotip arrays can further be used to provide an electron emission mechanism for injecting electrons into organic light emitting devices (OLED's). Using nanotip arrays as an electron injection electrode in an OLED can enhance the electron current density to the OLED compared to a conventional injection electrodes. Accordingly, higher efficiency and/or brighter devices may be achieved.

Nanotip arrays can also be used for ultra-fine nanoparticle formation such as, for example, Fe and/or Au nanoparticles. The surface structure of a nanotip array can provide a surface for the formation of metal particles. The nanotip structure can result in the formation of smaller particles compared to a planar surface. Moreover, the increased surface area due to the nanotip structure and additional smaller resulting particle size can make nanotip array/nanoparticle structures good candidates for catalytic applications.

Other potential applications include using nanotip arrays as special electrodes for electrochemistry.

EXAMPLE

An ECR-RIE chamber was constructed using a stainless steel wall and a water jacket for cooling. An ASTeX AX4400 ECR plasma source (from MKS Instruments, Andover, Mass.) was attached to the chamber. The chamber was provided with a quartz window to admit microwave energy into the chamber.

A gas mixture including Ar (5 sccm), $H_2$ (8 sccm), $CH_4$ (1 sccm) and $SiH_4$ (10%, diluted by He, 1 sccm) was introduced into a plasma-etch chamber containing a Si (100) substrate. The total gas pressure in the chamber was between 3 and 7 mTorr. The gases were obtained from Su Fan, Inc. (Taiwan). The gas purity was nominally 99.99%, 99.99%, 99.99% and 99.95% for the $SiH_4$, $CH_4$, $H_2$, and Ar, respectively. The substrate was heated to at least 200° C. An 875 Gauss DC magnetic field and a 2.45 GHz electric field were applied to the gas mixture to form high-density plasma. The substrate was exposed to the plasma for at least 10 minutes.

Upon removal from the chamber, the exposed surface of the substrate was studied using electron microscopy. Electron microscopy revealed a tip density of approximately $3 \times 10^{10}/cm^2$. Nanotip endpoint diameters were on average about 1 nm, and the nanotips had an aspect ratio of about 1:1,000.

Figure 4:
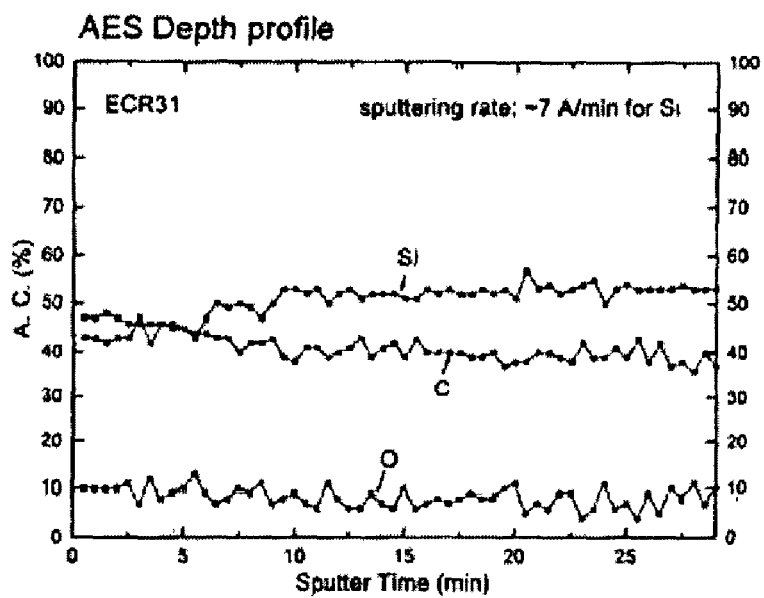
FIG. 4 is an Auger electron spectroscopy depth profile for a silicon nanotip array having SiC endpoints.

Nanotip composition was analyzed using Auger electron spectroscopy (AES). At the initial stage of the analysis, the electron beam was focused at the top of the nanotip array, and revealed approximately equal amount of silicon and carbon, consistent with the composition of SiC compound. As sputtering proceeded and the probe depth increased more silicon and less carbon content appeared, as shown in the time evolution of the AES signals in FIG. 4. This result suggests the nanotips contained the SiC phase predominantly at the top.

To verify the formation of SiC nanocrystallites as the nanomasks, which was supported by the nano-beam Auger analysis, high-resolution transmission electron microscope (HRTEM) was also employed to investigate the endpoint structure directly. HRTEM analysis of the nanotip showed a Si tip with a lattice spacing of 3.14 Å that corresponds to Si(111) and a SiC-capped endpoint of 2.58 Å lattice spacing, which was within 97% agreement with the 2.52 Å d-spacing of a cubic phase SiC(111).

Figure 5:
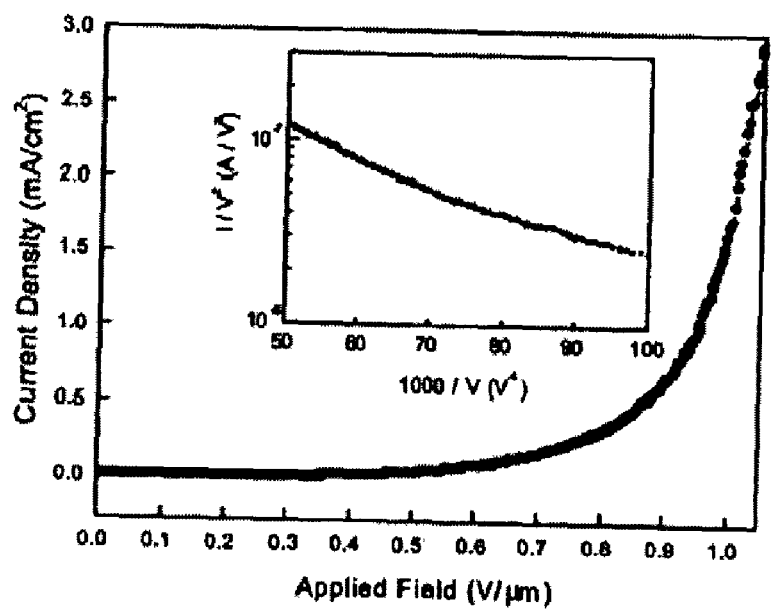
FIG. 5 is a plot of applied field vs. field emission current density for a silicon nanotip array. The inset shows the emission current data plotted in Fowler-Nordheim coordinates.

The field emission property of the SiC nanotip array is shown in FIG. 5. In this figure, current is plotted as a function of applied field. This nanotip array has a turn-on field of approximately 0.35 V/$\mu$m. Furthermore, current densities in excess of 3.0 mA/cm$^2$ are achieved.

OTHER EMBODIMENTS

A number of embodiments of the invention have been described. Nevertheless, it will be understood that various modifications may be made without departing from the spirit and scope of the invention. For example, while the above-described processes refer to ECR etching, other dry etching techniques, such as reactive ion etching using non-ECR ionization (e.g., inductively coupled plasma ("ICP"), capacitively coupled radio frequency ("RF") glow discharge plasma, microwave plasma, and ion-beam etching can also be used. Accordingly, other embodiments are within the scope of the following claims.

What is claimed is:

1. A method for making a nanotip array, the method comprising:
    exposing a substrate comprising a substrate material to a plasma sufficient to deposit a mask material comprising crystallites on a surface of the substrate material, thereby forming masked portions of the substrate and unmasked portions of the substrate; and
    etching substrate material at the unmasked portions of the substrate to form a plurality of nanotips in the nanotip array, wherein the plasma comprises mask components that form the mask material and exposing the substrate to the plasma and etching the unmasked portions occur simultaneously.

2. The method of claim 1, wherein there is substantially no etching of the substrate at the masked portions.

3. The method of claim 1, wherein the substrate is heated to at least 2000° C.

4. The method of claim 1, wherein the plasma chemically etches unmasked portions of the substrate.

5. The method of claim 1, wherein the plasma physically etches unmasked portions of the substrate.

6. The method of claim 1, wherein the mask components chemically react with each other to form the mask material.

7. The method of claim 1, wherein the mask material comprises SiC crystallites.

8. The method of claim 1, wherein the plasma comprises etch components that etch unmasked portions of the substrate.

9. The method of claim 1, wherein the masked portions have diameters less than 20 nm.

10. The method of claim 1, wherein the masked portions have diameters less than 10 nm.

11. The method of claim 1, wherein the masked portions have diameters less than 5 nm.

12. The method of claim 1, wherein the substrate comprises a substrate material that includes silicon, sapphire, quartz, silica, germanium, gallium nitride, gallium arsenide, gallium phosphide or a metal.

13. The method of claim 1, wherein at least some of the nanotips have a length of more than 500 nm.

14. The method of claim 1, wherein at least some of the nanotips have a length of more than 1,000 nm.

15. The method of claim 1, wherein at least some of the nanotips have an endpoint diameter of less than 10 nm.

16. The method of claim 1, wherein at least some of the nanotips have an endpoint diameter of less than 5 nm.

17. The method of claim 1, wherein at least some of the nanotips have an endpoint diameter of less than 2 nm.

18. The method of claim 1, wherein at least some of the nanotips have an endpoint that comprises a SiC crystallite.

19. The method of claim 1, further comprising ionizing a process gas mixture to form the plasma.

20. The method of claim 19, wherein the process gas mixture is ionized by exposing the process gas mixture to an electromagnetic field.

21. The method of claim 19, wherein the process gas mixture comprises a silicon-containing gas.

22. The method of claim 21, wherein the silicon-containing gas is a silane gas.

23. The method of claim 19, wherein the process gas mixture comprises a carbon-containing gas.

24. The method of claim 23, wherein the carbon-containing gas includes an alkane gas, and alkene gas, or an alkyne gas.

25. The method of claim 19, wherein a pressure of the process gas mixture is at least 0.1 mTorr.

26. The method of claim 19, wherein a pressure of the process gas mixture is no more than 10 mTorr.

27. The method of claim 19, wherein the process gas mixture comprises argon.

28. The method of claim 19, wherein the process gas mixture comprises hydrogen.

29. The method of claim 19, wherein the process gas mixture comprises a halogen or a halogenated material.

30. The method of claim 1, further comprising covering a premask portion of the substrate surface with a premask layer that prevents formation of nanotips in the premasked portions.

31. The method of claim 30, wherein the premask layer comprises silicon nitride, silicon dioxide or a metal.

32. The method of claim 1, further comprising positioning a template relative the substrate surface to control the location of nanotip formation on the substrate surface.

33. The method of claim 32, wherein the template comprises an anodic aluminum oxide template.

34. The method of claim 32, wherein the template comprises a zeolite template.

35. The method of claim 32, wherein the template comprises a porous silicon template.

36. The method of claim 32, wherein the template comprises a diamond template.

37. A method for forming nanotip arrays, the method comprising:
  forming SiC crystallites at a surface of a substrate, thereby forming masked portions of the substrate and unmasked portions of the substrate; and
  etching unmasked portions of the substrate to form the nanotip array.

38. The method of claim 37, wherein there is substantially no etching of the substrate at the masked portions.

39. The method of claim 37, further comprising exposing the substrate to a plasma under conditions sufficient to form the SiC crystallites and to etch unmasked portions of the substrate.

40. The method of claim 39, further comprising ionizing a process gas mixture to form the plasma.

41. The method of claims 40, wherein the process gas mixture is ionized by electron cyclotron resonance.

42. The method of claim 37, wherein the etching comprises chemical etching.

43. The method of claim 37, wherein the etching comprises physical etching.

44. The method of claim 37, wherein the forming and etching occur simultaneously.

45. A method for making a nanotip array, the method comprising:
  exposing a substrate comprising a substrate material to a plasma sufficient to deposit a mask material on a surface of the substrate material, thereby forming masked portions of the substrate and unmasked portions of the substrate; and
  etching substrate material at the unmasked portions of the substrate to form a plurality of nanotips in the nanotip array,
  wherein there are no masked portions of the substrate surface prior to exposing the substrate to the plasma and there is substantially no etching of the substrate at the masked portions and exposing the substrate to the plasma and etching the unmasked portions occur simultaneously.

46. A method for making a nanotip array, the method comprising:
  ionizing a process gas mixture to form the plasma, wherein the process gas mixture comprises at least one gas selected from the group consisting of a silicon-containing gas, an alkane gas, an alkene gas, an alkyne gas, and hydrogen;
  exposing a substrate comprising a substrate material to a plasma sufficient to deposit a mask material on a surface of the substrate material, thereby forming masked portions of the substrate and unmasked portions of the substrate; and etching substrate material at the unmasked portions of the substrate to form a plurality of nanotips in the nanotip array, wherein exposing the substrate to the plasma and etching the unmasked portions occur simultaneously.

47. The method of claim 46, wherein the process gas mixture is ionized by exposing the process gas mixture to an electromagnetic field.

48. The method of claim 46, wherein the silicon-containing gas is a silane gas.

49. A method for making a nanotip array, the method comprising:

exposing a substrate comprising a substrate material to a plasma sufficient to deposit a mask material on a surface of the substrate material, thereby forming masked portions of the substrate and unmasked portions of the substrate; and etching substrate material at the unmasked portions of the substrate to form a plurality of nanotips in the nanotip array, wherein the plasma comprises mask components that form the mask material and exposing the substrate to the plasma and etching the unmasked portions occur simultaneously and at least some of the nanotips have an endpoint that comprises a SiC crystallite.

50. A method for making a nanotip array, the method comprising:

positioning a template relative to a surface of a substrate comprising a substrate material;

exposing the substrate to a plasma sufficient to deposit a mask material on the surface of the substrate material, thereby forming masked portions of the substrate and unmasked portions of the substrate; and etching substrate material at the unmasked portions of the substrate to form a plurality of nanotips in the nanotip array, wherein the template comprises at least one material from the group consisting of anodic aluminum oxide, a zeolite, porous silicon, and diamond, the position of the template relative to the substrate surface controls the location of nanotip formation on the substrate surface, and the plasma comprises mask components that form the mask material and exposing the substrate to the plasma and etching the unmasked portions occur simultaneously.

* * * * *